United States Patent [19]
Benge

[11] Patent Number: 4,802,944
[45] Date of Patent: Feb. 7, 1989

[54] METHOD OF MAKING DEACTIVATABLE TAGS

[75] Inventor: S. Eugene Benge, Middletown, Ohio

[73] Assignee: Monarch Marking Systems, Inc., Dayton, Ohio

[21] Appl. No.: 177,815

[22] Filed: Mar. 28, 1988

Related U.S. Application Data

[63] Continuation of Ser. No. 81,096, Aug. 3, 1987, abandoned, which is a continuation-in-part of Ser. No. 41,556, Apr. 22, 1987, which is a continuation-in-part of Ser. No. 912,466, Sep. 29, 1986, Pat. No. 4,717,438.

[51] Int. Cl.$^4$ ............................................. B32B 31/16
[52] U.S. Cl. ...................................... 156/247; 156/52; 156/269; 156/272.2; 340/572; 361/402
[58] Field of Search ................. 156/52, 155, 247, 269, 156/272.2, 273.9; 333/185; 340/572; 361/402

[56] References Cited

U.S. PATENT DOCUMENTS 3,967,161 6/1976 Lichtblau ............................ 361/402
4,369,557 1/1983 Vandebult ........................ 361/402 X
4,555,291 11/1985 Tait et al. ......................... 156/267 X
4,567,473 1/1986 Lichtblau ............................ 340/572

FOREIGN PATENT DOCUMENTS

8605302 9/1986 Int'l Pat. Institute.

Primary Examiner—Robert A. Dawson
Attorney, Agent, or Firm—Joseph J. Grass

[57] ABSTRACT

This invention relates to a deactivatable tag useable with an electronic article surveillance system and comprised of planar conductive material cut into a pair of inverse, first and second spiral conductors wrapped about each other and positioned for capacitive and inductive coupling. The invention also relates to method of making tags wherein conductors are cut from a planar web of conductive material in a continuous process in a manner that the cutting results in the formation of two spiral conductors without accompanying waste of conductive material, and thereafter positioning the conductors to provide resonant circuits.

4 Claims, 12 Drawing Sheets

METHOD OF MAKING DEACTIVATABLE TAGS

CROSS-REFERENCE TO RELATED APPLICATIONS

This application is a continuation of application Ser. No. 81,096, filed Aug. 3, 1987, now abandoned, which in turn is a continuation-in-part of copending U.S. patent application Ser. No. 41,556 filed Apr. 22, 1987 of S. Eugene Benge, Warren J. Pape and Richard S. Vuketich, which in turn is a continuation-in-part of copending U.S. patent application Ser. No. 06/912,466 filed Sept. 29, 1986 of S. Eugene Benge and Robert Lee Froning, now U.S. Pat. No. 4,717,438, all of said applications having been assigned to Monarch Marking Systems, Inc.

BACKGROUND OF THE INVENTION

1. Field of the Invention

This invention relates to the art of resonant tags used in electronic article surveillance systems and to method of making such tags.

2. Brief Description of the Prior Art

The following patents are made of record; U.S. Pat. No. 3,240,647 to Morgan granted Mar. 15, 1966; U.S. Pat. No. 3,624,631 to Chomet granted Nov. 30, 1971; U.S. Pat. No. 3,810,147 to Lichtblau granted May 7, 1971; U.S Pat. No. 3,913,219 to Lichtblau granted Oct. 21, 1975; U.S. Pat. No. 4,482,874 to Rubertus et al granted Nov. 13, 1984; U.S. Pat. No. 4,555,291 to Tait et al granted Nov. 26, 1985; U.S. Pat. No. 4,567,473 to Lichtblau granted Jan. 28, 1986; and French patent no. 2,412,923 to Degueldre.

SUMMARY OF THE INVENTION

This invention relates to a method of making tags each having a resonant circuit for use in an electronic article surveillance system. This method has as one object the mass production on a continuous basis of such tags wherein there is virtually no waste of the materials of construction. The method of the invention avoids the need for chemical etching and plating used in certain prior art methods.

According to a specific embodiment of the method of the invention, a web of conductive material is cut into a pair of inverse spiral conductors disposed in contiguous relation and wound about each other, thereafter while supported in a first web the first conductors are separated from the second conductors which are supported in a second web, thereafter the first conductors and the second conductors are positioned into pairs of first and second conductors capable of being in capacitive and inductive coupled relationship, and thereafter connecting each pair of such conductors to provide tags each having a resonant circuit.

According to a specific embodiment of the tag according to the invention, there is a generally planar dielectric, inverse first and second spiral conductors in capacitively and inductively coupled relationship on opposite sides of the dielectric, means for electrically connecting the first and second conductors to provide a resonant circuit, wherein the first and second conductors are formed by cutting conductive planar material spirally to provide pairs of first and second inverse conductors, and positioning a pair of the first and second conductors in said relationship. It is preferred to make the tags in a longitudinal series and preferably with a plurality of laterally extending tags.

It is an object of the invention to provide simple yet efective methods of making reliable deactivatable resonant tags for use in electronic article surveillance systems.

It is an object of the invention to provide improved, reliable, deactivatable resonant tags which can be made on a production basis.

According to the invention, there is provided a method of making a deactivatable tag which includes the steps of providing a resonant circuit responsive to receipt of a first energy level signal to emit an alarm signal to indicate the presence of the resonant circuit in an interrogation zone, the circuit including an inductor having a spiral conductor, and providing an activatable connection to the spiral conductor including normally non-conductive material which can be rendered conductive in response to a second energy level signal at an energy level higher than the first energy level signal. It is preferred that the step of providing the activatable connection includes the step of applying the normally non-conductive material between spaced but connected portions of the spiral conductor.

One specific embodiment includes the steps of coating or printing a normally non-conductive but activatable conductor-containing material onto a support so as to extend across two and preferably all the turns of the spiral conductor and thereafter coating or printing a conductive material over the normally non-conductive material in electrically isolated relationship to the spiral conductor. When the tag is put into use, it can be deactivated by subjecting the resonant circuit to the second energy level signal. The second energy level signal changes the normally non-conductive material into a conductive material.

Another specific embodiment includes the step of positioning a web of conductive material adjacent one of the spiral conductors, with the conductive material web having a layer of a normally non-conductive material electrically isolating the conductive material web from the spiral conductor, wherein the normally non-conductive material can be rendered conductive in response to the second energy level signal.

Another specific embodiment includes the steps of providing a resonant circuit responsive to receipt of a first energy level signal to emit an alarm signal to indicate the presence of the resonant circuit in an interrogation zone, and positioning an insulated conductor having a breakdown coating in contact with the circuit for deactivating the tag in response to a second energy level signal at an energy level higher than the first energy level signal.

It has been found that a deactivatable tag can be accidentally deactivated prematurely before the tag is ready to be willfully deactivated. Such deactivation can occur during manufacture or even after manufacture such as during storage or when a web of the tags is being printed upon in a marking machine. The deactivation can occur due to static electricity which builds up and can arc in a longitudinal direction along the web between adjacent resonant circuits if the resonant circuits touch each other or are too close to each other and additionally if a normally non-conductive breakdown deactivator extends longitudinally from resonant circuit-to-resonant circuit. By spacing the resonant circuits from each other in the longitudinal direction of the web and by separating the web of deactivation material into separate spaced strips so that there is one deactivator strip for each resonant circuit, the premature deactivation of adjacent resonant circuits is prevented, even though both the conductive material of which the resonant circuits are formed and the deactivator material is originally in web form.

DESCRIPTION OF THE PREFERRED EMBODIMENTS

Figure 1:
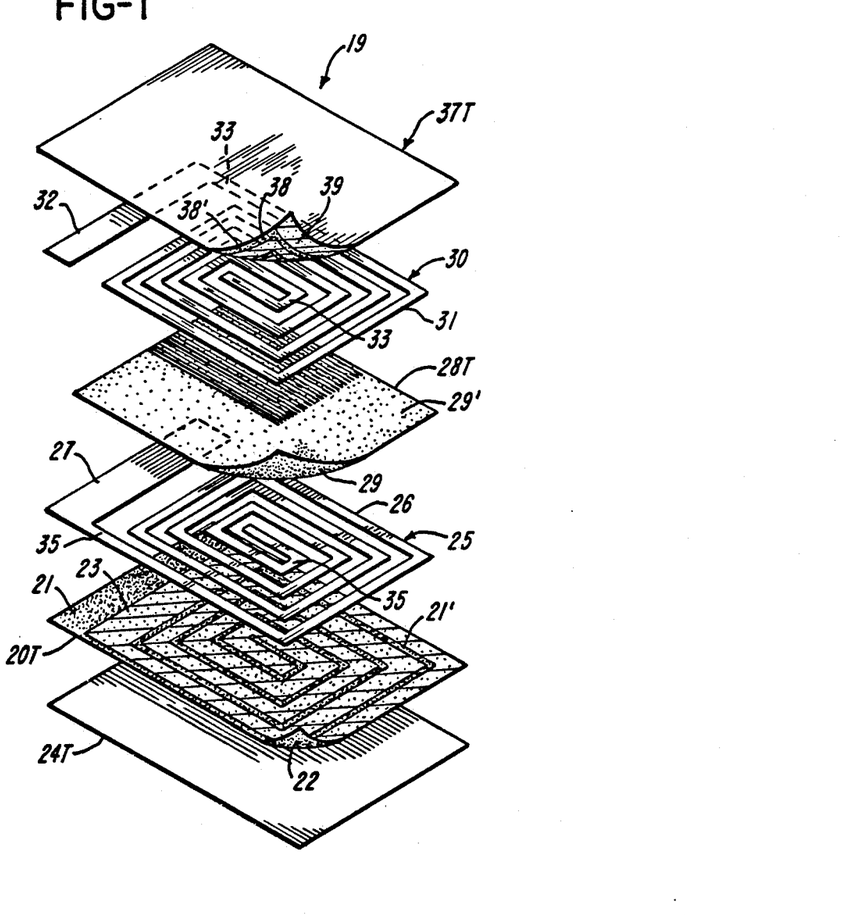
FIG. 1 is an exploded perspective view of a tag in accordance with an embodiment of the invention.

Referring initially to FIG. 1, there is shown an exploded view of a tag generally indicated at 19. The tag 19 is shown to include a sheet 20T having pressure sensitive adhesive 21 and 22 on opposite faces thereof. A mask 23 in a spiral pattern covers a portion of the adhesive 21 and a release sheet 24T is releasably adhered to the adhesive 22. The mask 23 renders the adhesive 21 which it covers non-tacky or substantially so. A conductor spiral indicated generally at 25 includes a spiral conductor 26 having a number of turns. The conductor 26 is of substantially the same width throughout its length except for a connector bar 27 at the outer end portion of the conductor spiral 26. There is a sheet of dielectric 28T over and adhered to the conductor spiral 25 and the underlying sheet 20T by means of adhesive 29. A conductor spiral generally indicated at 30 includes a spiral conductor 31 having a number of turns. The conductor 31 is adhered to adhesive 29 on the dielectric 28T. The conductor 31 is substantially the same width throughout its length except for a connector bar 32 at the outer end portion of the conductor spiral 30. The conductor spirals 25 and 30 are generally aligned in face-to-face relationship except for portions 33 which are not face-to-face with the conductor 26 and except for portions 35 which are not face-to-face with the conductor 31. A sheet 37T has a coating of a pressure sensitive adhesive 38 masked off in a spiral pattern 39. The exposed adhesive 38' is aligned with the conductor spiral 30. Adhesive is shown in FIG. 1 by heavy stippling and the masking is shown in FIG. 1 by light stippling with cross-hatching. The connector bars 27 and 32 are electrically connected, as for example by staking 90. It should be noted that the staking 90 occurs where connector bars 27 and 32 are separated only by adhesive 29. There is no paper, film or the like between the connector bars 27 and 32. Accordingly, the staking disclosed in the present application is reliable.

Figure 2:
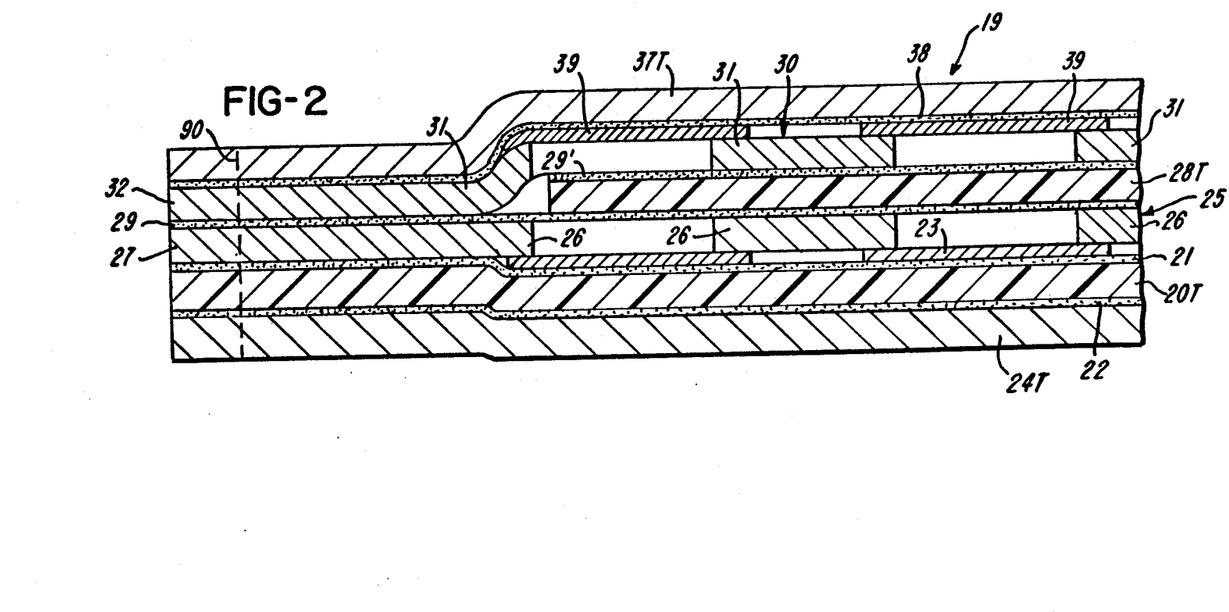
FIG. 2 is a fragmentary sectional view of the tag shown in FIG. 1.
Figure 3:
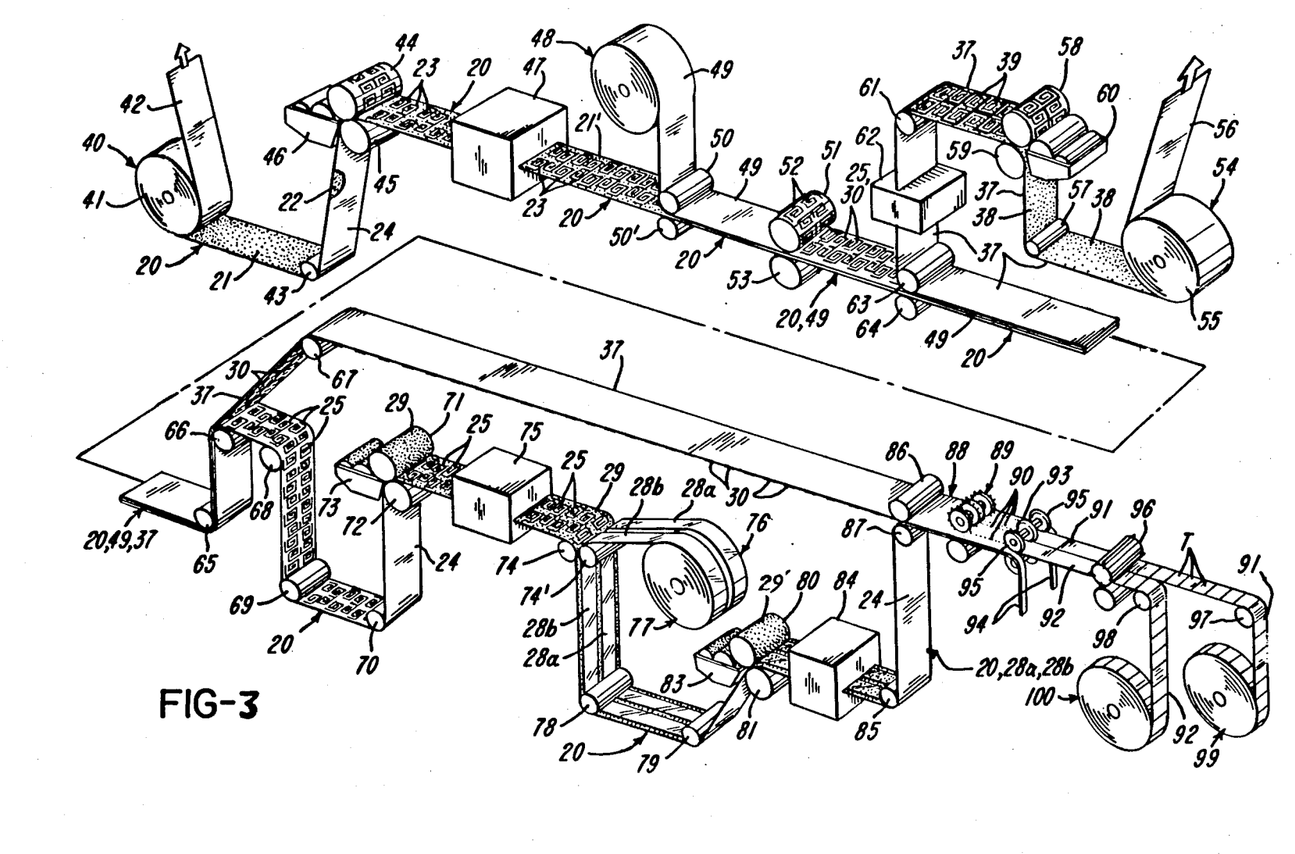
FIG. 3 is a diagrammatic perspective view illustrating method of making a tag in accordance with the invention.
Figure 4:
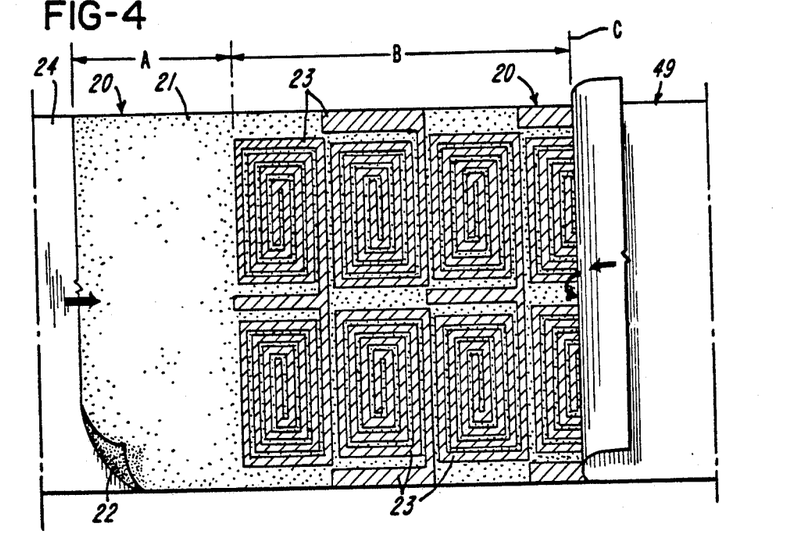
FIG. 4 is a diagrammatic top plan view showing a mask having been applied to a first adheivve coated web and showing an electrically conductive web being laminated to the masked first adhesive coated web.
Figure 5:
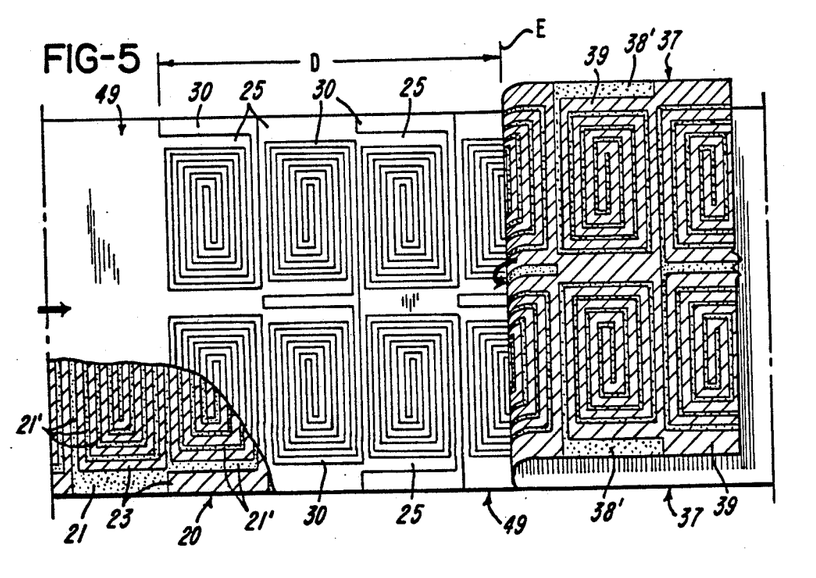
FIG. 5 is a diagrammatic top plan view showing the conductive web having been cut to provide first and second pairs of conductors and showing a masked second adhesive coated web being laminated to the conductive web.

With reference to FIG. 3, there is shown diagrammatically a method for making the tag 19 shown in FIGS. 1 and 2. A roll 40 is shown to be comprised of a composite web 41 having a web 20 with a full-gum or continuous coatings of pressure sensitive adhesive 21 and 22 on opposite faces thereof. The web 20 is "double-faced" with adhesive. A release liner or web 42 is releasably adhered to the upper side of the web 20 by the pressure sensitive adhesive 21, and the underside of the web 20 has a release liner or web 24 releasably adhered to the pressure sensitive adhesive 22. As shown, the release liner 42 is delaminated from the web 20 to expose the adhesive 21. The adhesive coated web 20 together with the release liner 24 pass partially about a sandpaper roll 43 and between a pattern roll 44 and a back-up roll 45 where mask patterns 23 are applied onto the adhesive 21 to provide longitudinally recurring adhesive patterns 21'. Masking material from a fountain 46 is applied to the pattern roll 44. With reference to FIG. 4, the portion marked A represents the portion of the web 20 immediately upstream of the pattern roll 44. The portion marked B shows the mask patterns 23 printed by the roll 44. The patterns 23 are represented by cross-hatching in FIG. 4. With reference to FIG. 3, the web 20 now passes through a dryer 47 where the mask patterns 23 are dried or cured. The adhesive 21 is rendered non-tacky at the mask patterns 23. A web 49 of planar, electrically conductive material such as copper or aluminum from a roll 48 is laminated onto the coated web 20 as they pass between laminating rolls 50 and 50'. Reference character C in FIG. 4 denotes the line where lamination of the webs 20 and 49 occurs. With reference to FIG. 3, the laminated webs 20 and 49 now pass between a cutting roll 51 having cutting blades 52 and a back-up roll 53. The blades 52 cut completely through the conductive material web 49 but preferably do not cut into the web 20. The blades 52 cut the web 49 into a plurality of series of patterns 25 and 30 best shown in the portion marked D in FIG. 5. With reference again to FIG. 3, there is shown a roll 54 comprised of a composite web 55 having a web 37 with a full-gum or continuous coating of pressure sensitive adhesive 38 and a release liner 56 releasably adhered to the adhesive 38 on the web 37. The release liner 56 is separated from the web 37 and the web 37 passes about a sandpaper roll 57. From there the web 37 passes between a pattern roll 58 and a back-up roll 59 where mask patterns 39 are applied onto the adhesive 38 to render the adhesive 38 non-tacky at the mask patterns 39 to provide longitudinally recurring adhesive patterns 38' (FIG. 1). Masking material from a fountain 60 is applied to the pattern roll 58. The masking material of which the patterns 23 and 39 are comprised is a commercially available printable adhesive deadener such as sold under the name "Aqua Superadhesive Deadener by Environmental Inks and Coating Corp, Morganton, N.C. From there the web 37 passes partially about a roll 61 and through a dryer 62 where the mask patterns 39 are dried or cured. The adhesive 38 is rendered non-tacky at the mask patterns 39. From there the webs 20, 49 and 37 pass between laminating rolls 63 and 64. FIG. 5 shows that lamination occurs along line E where the web 37 meets the web 49. When thus laminated, each adhesive pattern 21' registers only with an overlying conductor spiral 25 and each adhesive pattern 38' registers only with an underlying conductor spiral 30.

Figure 6:
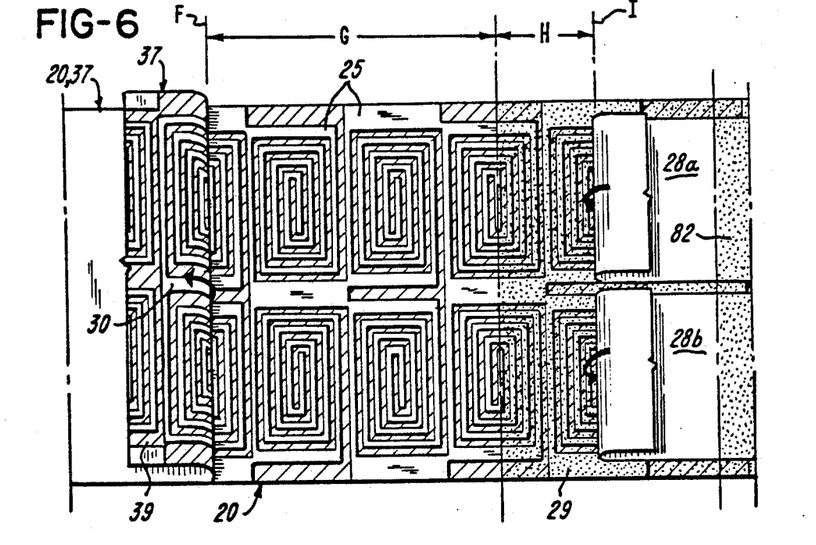
FIG. 6 is a diagrammatic top plan view showing the first coated web with the first conductors adhered thereto being separated relative to the second coated web with the second conductors adhered thereto, and showing further the first coated web having been recoated with adhesive and two webs of dielectric being laminated to the recoated first coated web, and showing the dialectric webs having been coated with adhesive.

The webs 20, 37 and 49 pass successively partially about rolls 65 and 66 and from there the web 37 delaminates from the web 20 and passes partially about a roll 67. At the place of delamination, the web 49 separates into two webs of conductor spirals 25 and 30. As shown in FIG. 6, delamination occurs along the line marked F. When delamination occurs, the conductor spirals 30 adhere to the adhesive patterns 38' on the web 37, and the conductor spirals 25 adhere to the adhesive patterns 21' on the web 20. Thus, the conductor spirals 30 extend in one web and the spirals 25 extend in another web. The web 20 passes partially about rolls 68, 69 and 70 and from there pass between an adhesive coating roll 71 and a back-up roll 72. Adhesive 29 from a fountain 73 is applied to the roll 71 which in turn applies a uniform or continuous coating of adhesive 29 to the web 20 and over conductive spirals 25. The portion marked G in FIG. 6 shows the portion of the web 20 and conductor spirals 25 between the spaced rolls 66 and 72. The portion marked H shows the portion of the web 20 between the spaced rolls 72 and 74. With reference to FIG. 3, the web 20 passes through a dryer 75 where the adhesive 29 is dried. A plurality, specifically two laterally spaced dialectric webs 28a and 28b wound in rolls 76 and 77 are laminated to the web 20 as the webs 20, 28a and 28b pass between the rolls 74 and 74'. This laminating occurs along reference line I indicated in FIG. 6. With reference to FIG. 3, the web 20 with the conductor spirals 25 and the dialectric webs 28a and 28b pass about rolls 78 and 79 and pass between an adhesive applicator roll 80 and a back-up roll 81. The roll 80 applies adhesive 29' received from a fountain 83 to the webs 28a and 28b and to the portions of the web 20 not covered thereby. From there, the webs 20, 28a and 28b pass through a dryer 84 and partially about a roll 85.

Figure 7:
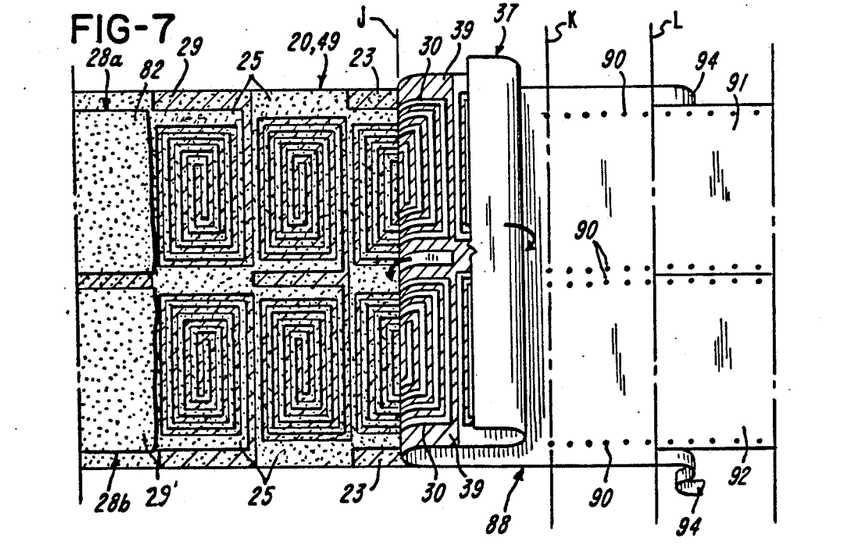
FIG. 7 is a diagrammatic top plan view showing the second coated web with the second conductors adhered thereto having been shifted and laminated over and to the dialectric webs and to the first coated web with the first conductors to provide a composite tag web, showing the staking of the first and second conductors of each tag to provide resonant circuits for each tag, and showing slitting of the composite tag web to provide a plural series of composite tag webs.

The web 37 which had been separated from the web 20 is laminated at the nip of laminating rolls 86 and 87 along a line marked J in FIG. 7 to provide a composite tag web generally indicated at 88. The webs 20, 28a, 28b and 37 are laminated between rolls 86 and 87 after the conductor spirals 30 have been shifted longitudinally with respect to the conductor spirals 25 so that each conductor spiral 30 is aligned or registered with an underlying conductor spiral 25. The shifting can be equal to the pitch of one conductor spiral pattern as indicated at p (FIG. 9) plus the width w of one conductor, or by odd multiples of the pitch p plus the width w of one conductor. Thus, each pair of conductor spirals 25 and 30 is capable of making a resonant circuit detectable by an appropriate article surveillance circuit.

Figure 8:
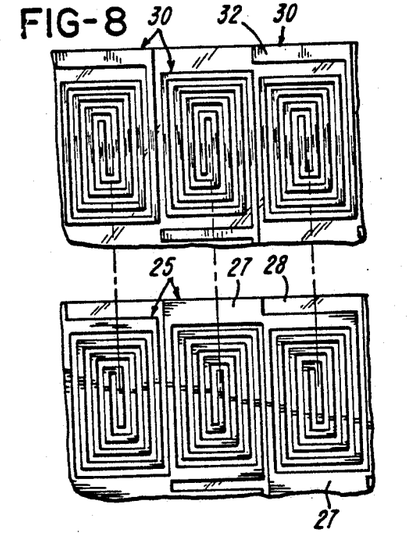
FIG. 8 is a vertically exploded view showing the first and second coated webs with the first and second conductors that result from cutting the electrically conductive web spirally.
Figure 9:
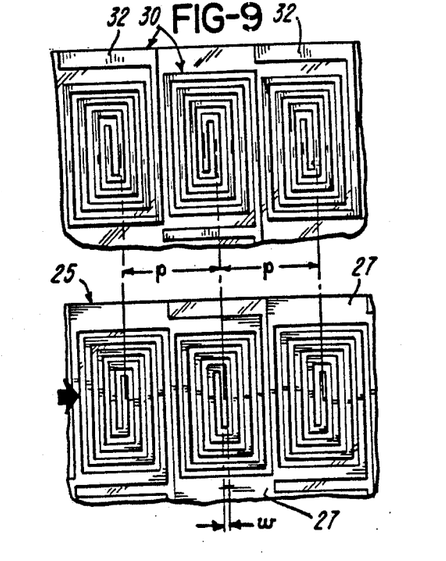
FIG. 9 is a top plan view showing the first and second coated webs shifted by a distance equal to the width of one conductor spiral plus the width of one conductor.
Figure 10:
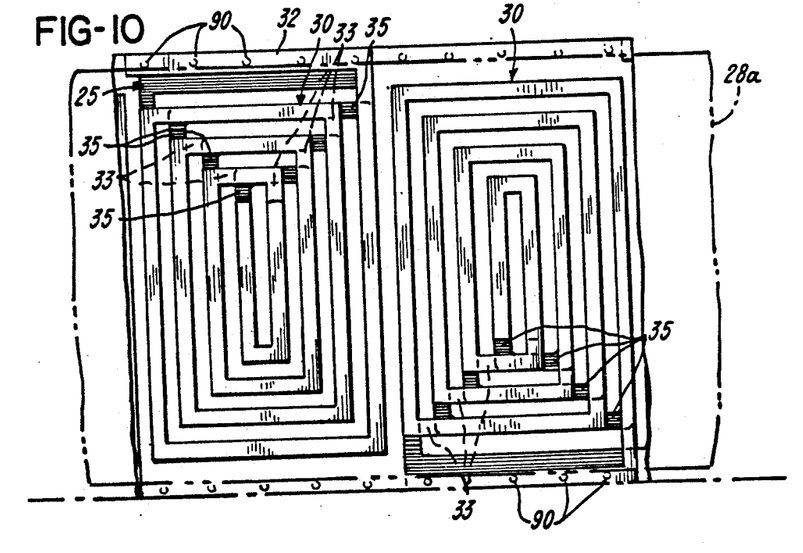
FIG. 10 is a top plan view of two tags with the dialectric web shown in phantom lines.

FIG. 8 shows the web 20 and the web 37 rotated apart by 180°. FIG. 9 shows the web 20 and the web 37 rotated apart by 180° and as having been shifted with respect to each other so that the conductor spirals 25 and 30 are aligned. As best shown in FIG. 10, the dielectric 28a terminates short of stakes 90 resulting from the staking operation. By this arrangement the stakes 90 do not pass through the dielectric 28a (or 28b). FIG. 10 shows the conductor spirals 25 and 30 substantially entirely overlapped or aligned with each other, except as indicated at 35 for the conductor spiral 25 and as indicated at 33 for the conductor spiral 30. Each circuit is completed by staking the conductor bars 27 and 32 to each other as indicated at 90 or by other suitable means. The staking 90 is performed by four spiked wheels 89 which make four stake lines 90 in the composite web 88. The spiked wheels 89 pierce through the conductor bars 27 and 32 and thus bring the conductor bars 27 and 32 into electrically coupled relationship. The web composite 88 is slit into a plurality of narrow webs 91 and 92 by slitter knife 93 and excess material 94 is trimmed by slitter knives 95. The webs 91 and 92 are next cut through up to but not into the release liner 24 by knives on a cutter roll 96, unless it is desired to cut the tags T into separated tags in which event the web 88 is completely severed transversely. As shown, the webs 91 and 92 continue on and pass about respective rolls 97 and 98 and are wound into rolls 99 and 100. As shown in FIG. 7, the staking 90 takes place along a line marked K and the slitting takes place along a line marked L.

The sheet 37T, the dialectric 28T, the sheet 20T and the sheet 24T are respectively provided by cutting the web 37, the web 28a (or 28b), the web 20 and the web 24.

Figure 11:
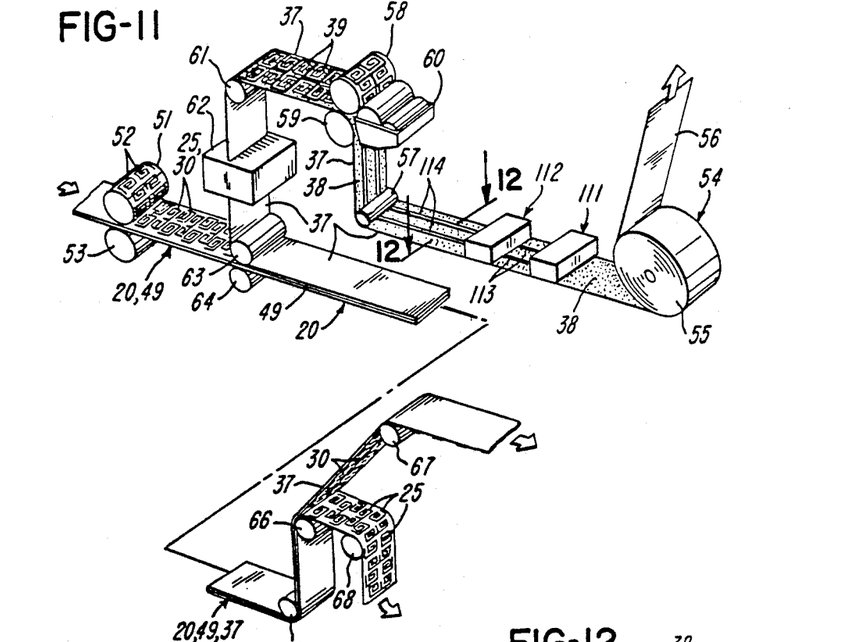
FIG. 11 is a fragmentary perspective view which, when taken together with the preceding figures of the drawings, illustrates an improved method of making deactivatable tags.
Figures 12, 13:
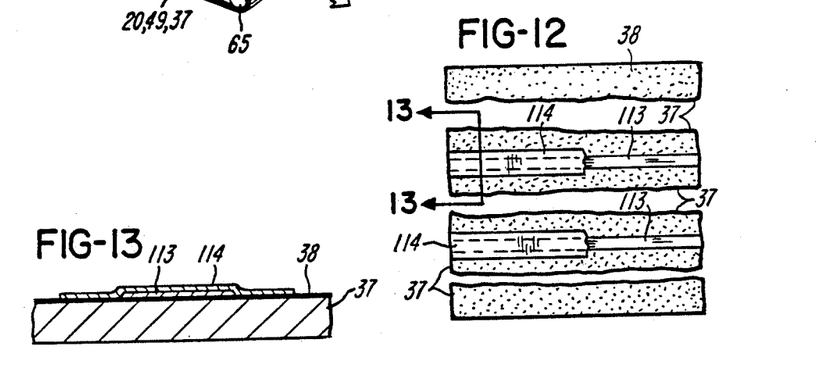
FIG. 12 is a fragmentary top plan view taken along line 12—12 of FIG. 11.
FIG. 13 is a sectional view taken along line 13—13 of FIG. 12.

FIG. 11 is essentially a duplicate of a portion of FIG. 3, but a pair of coating and drying stations generally indicated at 111 and 112 where respective coatings 113 and 114 in the form of continuous stripes are printed and dried. The coating 113 is conductive and is applied directly onto the pressure sensitive adhesive 38 on the web 37. The coatings 114 are wider than the respective coatings 113 which they cover to assure electrical isolation, as best shown in FIGS. 12 and 13. The coatings 114 are composed of a normally non-conductive activatable material. The remainder of the process is the same as the process taught in connection with FIGS. 1 through 10.

Figure 14:
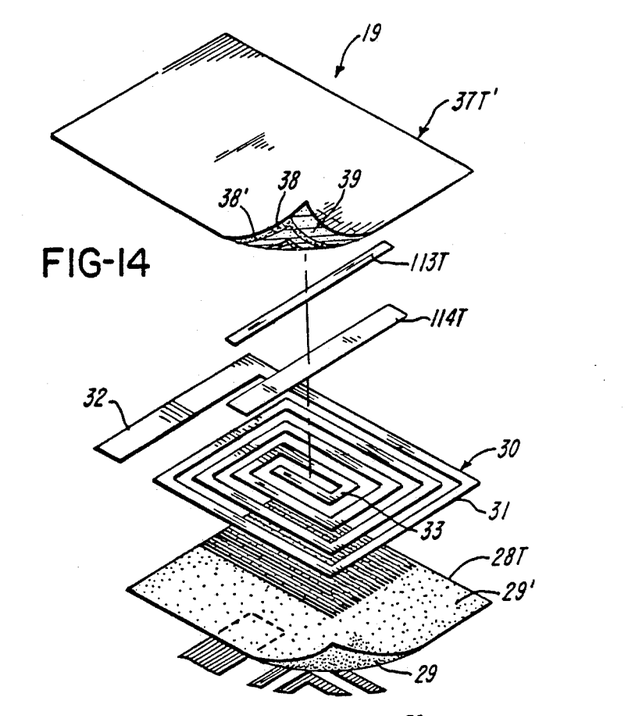
FIG. 14 is a fragmentary perspective view similar to FIG. 1, but showing one embodiment of structure for deactivating the tag.
Figure 15:
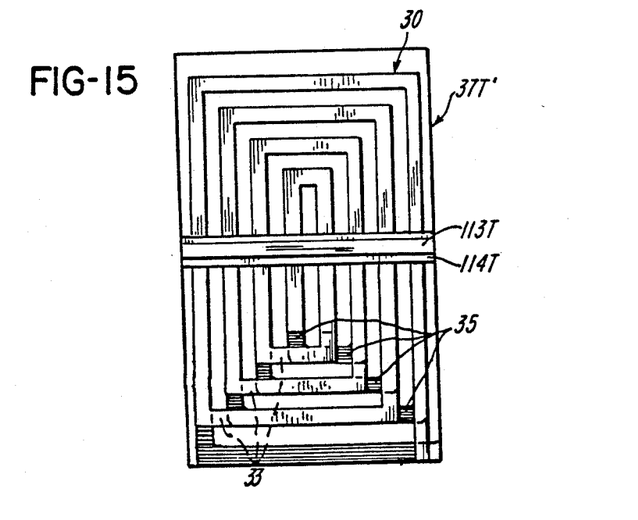
FIG. 15 is a fragmentary top plan view of the tag shown in FIG. 14.

With reference to FIGS. 14 and 15, there is shown a fragment of the finished tag 37T' with the coatings 113 and 114 having been severed as the tag 37T' is severed from the tag web as indicated at 113T and 114T respectively. As shown the coating 113T is of constant width and thickness throughout its length and the coating 114T is of constant width and thickness but is wider than the coating 113T. The coating 113T which is conductive is thus electrically isolated from the conductor spiral 30. The coatings 113T and 114T comprise an activatable connection AC which can be activated by subjecting the tag to a high level of energy above that for causing the resonant circuit to be detected at an interrogation zone.

Figure 16:
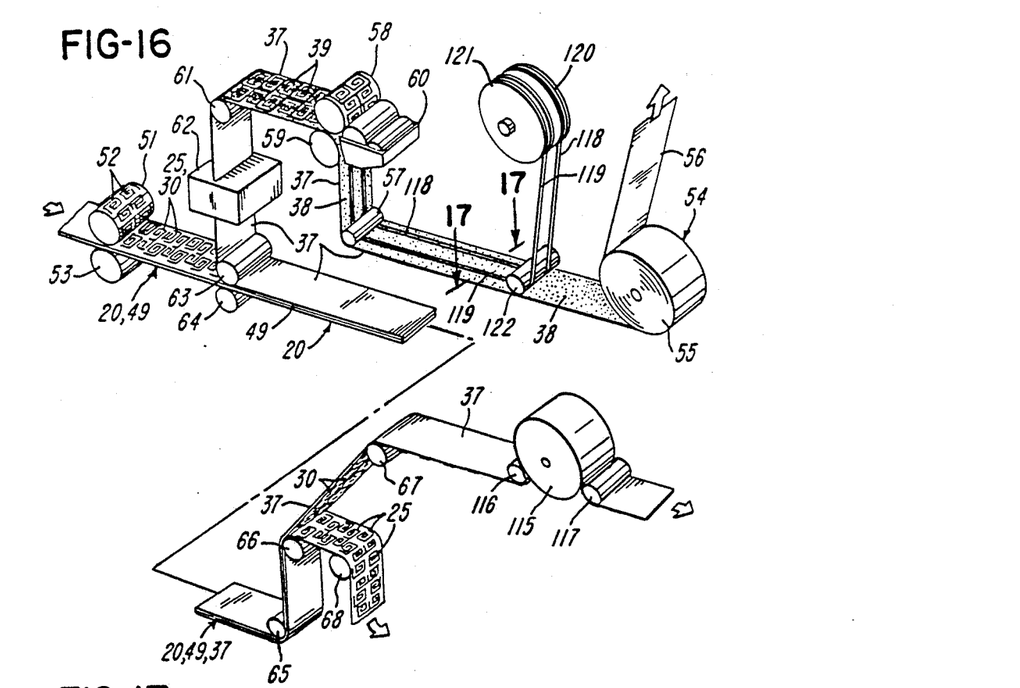
FIG. 16 is a fragmentary perspective view which, taken together with FIGS. 1 through 10, illustrated an alternative improved method of making deactivatable tags.
Figure 17:
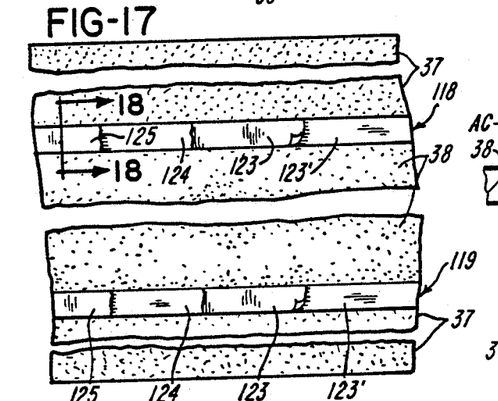
FIG. 17 is a fragmentary top plan view taken along line 17—17 of FIG. 16.
Figure 18:
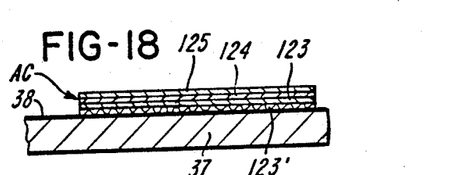
FIG. 18 is a sectional view taken along line 18—18 of FIG. 17.

FIG. 16 is essentially a duplicate of a portion of FIG. 3, but a pair of webs 118 and 119 are adhered to the adhesive 38 on the web 37. The webs 118 and 119 are wound onto spaced reels 120 and 121. The webs 118 and 119 pass from the reels 120 and 121 partially about a roll 122. The webs 118 and 119 are spaced apart from each other and from the side edges of the web 37. The webs 118 and 119 are identical in construction, and each includes a thin layer of conductive material 123 such as copper or aluminum on a layer of paper 123', a high temperature, normally non-conductive, activatable, conductor-containing layer 124, and a low temperature, normally non-conductive, activatable, conductor-containing layer 125. The layers 124 and 125 contain conductors such as metal particles or encapsulated carbon. The layer 125 bonds readily when heated, so a drum heater 115 is positioned downstream of the roll 67 (FIGS. 3 and 16) and upstream of the rolls 86 and 87 (FIG. 3). The heated circuits 30, heat the layer 125 and a bond is formed between the circuits 30 and the layer 125. Rolls 116 and 117 (FIG. 16) guide the web 37 about the drum heater 115. The heating of the layer 125 has some tendency to break down the normally non-conductive nature of the layer 125, but this is not serious because the layer 124 is not broken down or activated by heat from the drum heater 115.

Figure 19:
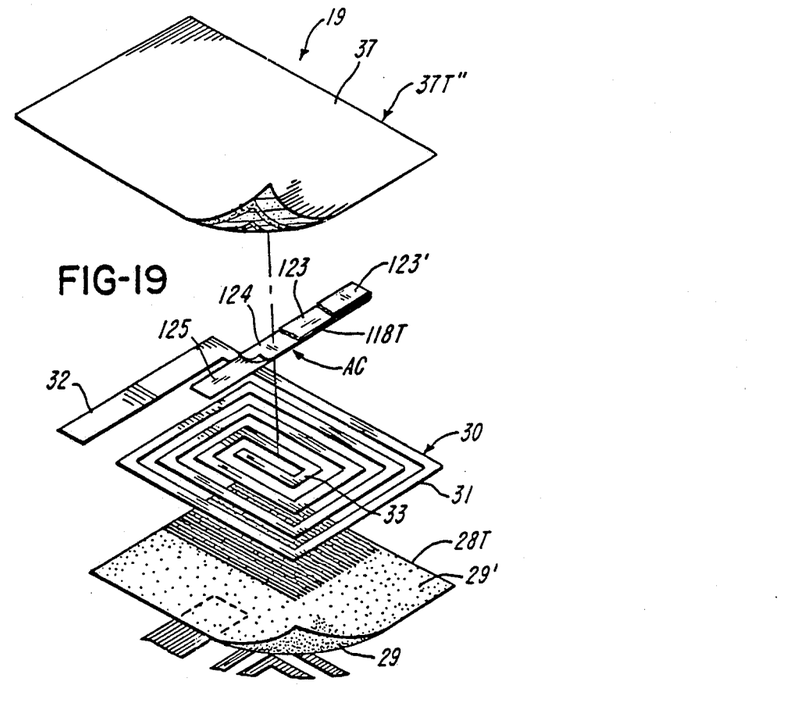
FIG. 19 is a fragmentary perspective view similar to FIG. 14 but showing another embodiment of structure for deactivating the tag.
Figure 20:
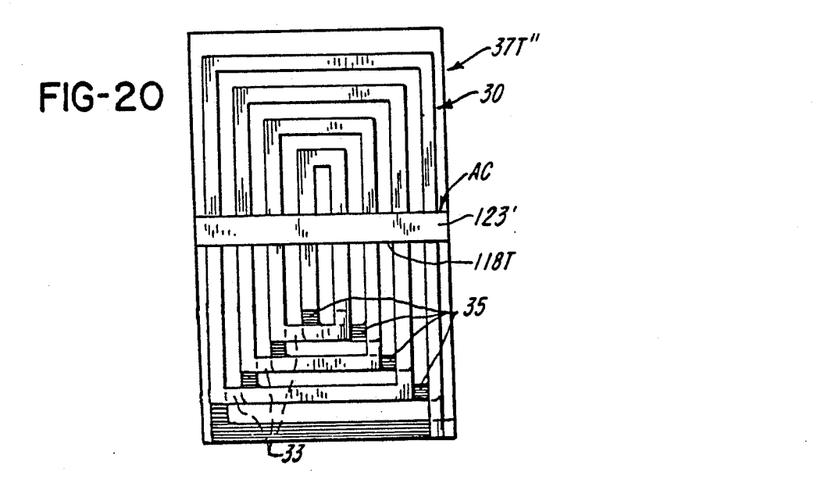
FIG. 20 is a fragmentary top plan view of the tag shown in FIG. 19.

With reference to FIGS. 19 and 20, there is shown a fragment of a finished tag 37T" with the webs 118 and 119 having been severed so as to be coextensive with the tag 37T" and is indicated at 118T. The web strip or stripe 118T includes the paper layer 123', the conductive layer or conductor 123 and the normally non-conductive layers 124 and 125. The layers 123, 124 and 125 are shown to be of the same width and comprise an activatable connection AC. Both coatings 124 and 125 electrically isolate the conductor 123 form the conductor spiral 30. In other respects the tag 37T" is identical to the tag 37T' and is made by the same process as depicted for example in FIG. 3.

Figure 21:
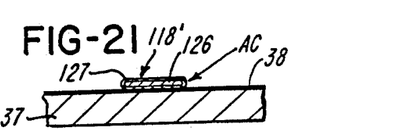
FIG. 21 is a sectional view similar to FIG. 18 but showing an alternative structure for deactivating the tag.

The embodiment of FIG. 21 is identical to the embodiment of FIGS. 16 through 20 except that instead of the webs 118 and 119 there are a pair of webs comprised of flat bands, one of which is shown in FIG. 21 and is depicted at 118'. The band 118' is comprised of a web or band conductor 126 of a conductive material such as copper enclosed in a thin coating of a non-conductive material 127. The band 118' comprises an activatable connection AC. As seen in FIG. 21, the upper surface of the coating 127 electrically isolates the conductor 126 from the conductor spiral 30. The band 118' is processed according to one specific embodiment, by starting with coated motor winding wire, Specification No. 8046 obtained from the Belden Company, Geneva, Ill. 60134 U.S.A. and having a diameter of about 0.004 inch with an insulating coating of about 0.0005, flattening the wire between a pair of rolls into a thin band having a thickness of 0.0006 inch. Thus processed, the insulating coating is weakened to a degree which breaks down when the resulting tag is subjected to a sufficiently high energy level signal. The coating 118' is thus termed a "breakdown coating" because it acts as an insulator when the tag is subjected to an interrogation signal at a first energy level but no longer acts as an electrical insulator when subjected to a sufficently higher energy level signal. The conductor 126 accordingly acts to short out the inductor 30 at the higher energy level signal.

The embodiments depicted in FIGS. 11 through 20 and described in connection therewith enable the tag 37T' or 37T" to be detected in an interrogation zone when subjected to a radio frequency signal at or near the resonant frequency of the resonant circuit. By sufficiently increasing the energy level of the signal, the normally non-conductive coating 114 (or 114T), or 124 and 125 becomes conductive to alter the response of the resonant circuit. This is accomplished in a specific embodiment by using a normally non-conductive coating to provide an open short-circuit between different portions of the conductor spiral 30.

When the tag is subjected to a high level of energy, in the embodiments of FIGS. 11 through 15, and 16 through 20 the normally non-conductive coating becomes conductive and shorts out the inductor. Thus, the resonant circuit is no longer able to resonate at the proper frequency and is unable to be detected by the receiver in the interrogation zone.

While the illustrated embodiments disclose the activatable connection AC provided by an additional conductor as extending across all the turns of the conductor spiral 30 and by a normally non-conductive material or breakdown insulation electrically isolating the conductor from the conductor spiral 30 and also extending across all of the turns of the conductor spiral 30, the invention is not to be considered limited thereby.

By way of example, not limitation, examples of the various coatings are stated below:

I. For the embodiment of FIGS. 11 through 15

A. Examples of the normally non-conductive coating 114 are:

Example 1

| | Parts by Weight |
|---|---|
| cellulose acetate (C.A.) powder (E-398-3) | 60 |
| acetone | 300 |
| Mixing procedure: Solvate C.A. powder in acetone with stirring. | |
| C.A./copper dispersion above C.A. solution (16% T.S.) | 15 |
| copper 8620 powder | 2.5 |
| Mixing procedure: Add copper powder to C.A. solution with adequate stirring to effect a smooth metallic dispersion. | |

Example 2

| | Parts by Weight |
|---|---|
| acrylvid B-48N (45% in toluene) | 30 |
| acetone | 20 |
| isopropanol | 3 |
| Above solution (25% T.S.) | 10 |
| copper 8620 powder | 5 |
| Mixing procedure: disperse copper powder into B-48N solution (Percent copper powder is 60-70% on dry weight basis.) | |

Examples of the conductive coating 113 are:

Example 1

| | Parts by Weight |
|---|---|
| acryloid B-67 acrylic (45% in naptha) | 25 |
| naptha | 16 |
| silflake #237 metal powder | 42 |
| Mixing procedure: add metal powder to solvent and wet out. Add solvated acrylic and stir well to disperse. Mix or shake well prior to use. (75% to 85% conductive metal on dry weight basis.) | |

Example 2

| | |
|---|---|
| acryloid NAD-10 (40% in naptha) | 10 |
| silflake #237 metal powder | 20 |
| Mixing procedure: Add metal powder to acrylic dispersion with stirring. | |

Example 3

| | |
|---|---|
| S & V aqueous foil ink OFG 11525 (37% T.S.) | 5 |
| silflake #237 metal powder | 8 |
| Mixing procedure: Add metal powder to aqueous dispersion slowly with adequate agitation to effect a smooth metallic dispersion. | |

I. For the embodiment of FIGS. 16 through 20

A. Examples of the low temperature coating 125 are:

Example 1

| | Parts by Weight |
|---|---|
| acryloid NAD-10 dispersion (30% T. Solids) | 10 |
| naptha | 2 |
| copper 8620 copper powder | 5 |
| Mixing procedure: wet copper powder with Naptha and disperse completely. Add NAD-10 dispersion slowly with stirring. Mix well or shake before use. | |

Example 2

| | |
|---|---|
| polyester resin (K-1979) | 28 |
| ethanol | 10 |
| isopropanol | 10 |
| ethyl acetate | 20 |
| above polyester solution | 10 |
| copper 8620 powder | 2.5 |
| Mixing procedure: add copper powder to polyester solution while stirring to effect a smooth metallic dispersion. (48% copper powder on dry basis) | |

B. Examples of the high temperature coating 124 are:

Example 1

| | |
|---|---|
| cellulose acetate butyrate (C.A.B.)(551-0.2) | 40 |
| toluene | 115 |
| Ethyl Alcohol | 21 |
| Above C.A.B. solution (22.7%) | 10 |
| toluene | 2 |
| copper 8620 copper powder | 5 |
| Mixing procedure: wet copper powder with solvent and add C.A.B. solution with stirring. | |

Example 2

| | |
|---|---|
| acryloid B-48N (45% in toluene) | 30 |
| acetone | 20 |
| isopropanol | 3 |
| Above solution (25% T.S.) | 10 |
| copper 8620 copper powder (Dry weight basis - copper is 60-70%) | 5 |
| Mixing procedure: add copper powder to above solution with proper agitation to effect a smooth metallic dispersion. | |

The materials used in the above examples are obtainable from the following suppliers:

Acryloid NAD-10, Acryloid B-48N and Acryloid B-67, Rohm & Haas, Philadelphia, Pa.;

Cellulose Acetate (E-398-3) and Cellulose Acetate Butyrate (551-0.2), Eastman Chemical Products, Inc., Kingsport, Tenn.;

Copper 8620, U.S. Bronze, Flemington, N.J.; Silflake #237, Handy & Harmon, Fairfield, Conn.;

Krumbhaar K-1979, Lawter International, Inc., Northbrook, Ill.;

Aqeuous foil ink OFG 11525, Sinclair & Valentine, St. Paul, Minn.

FIGS. 22 through 25 depict an improved method over the embodiment of FIGS. 11 through 15, over the embodiment of FIGS. 16 through 20, and over the embodiment of FIG. 21. The method of the embodiment of FIGS. 22 through 25 relates to the formation of longitudinally spaced deactivatable resonant circuits arranged in a web. The longitudinal spacing of the resonant circuits assures that electrostatic charge that can prematurely deactivate one resonant circuit in the web cannot arc longitudinally to the other resonant circuits in the web to cause their premature deactivation. Where possible, the same reference character will be used in the embodiment of FIGS. 22 through 25 as in the embodiment of FIGS. 16 through 20 to designate components having the same general construction and function, but increased by 200. It will be appreciated that reference is also made to FIGS. 3, 5 and 6.

Figure 22:
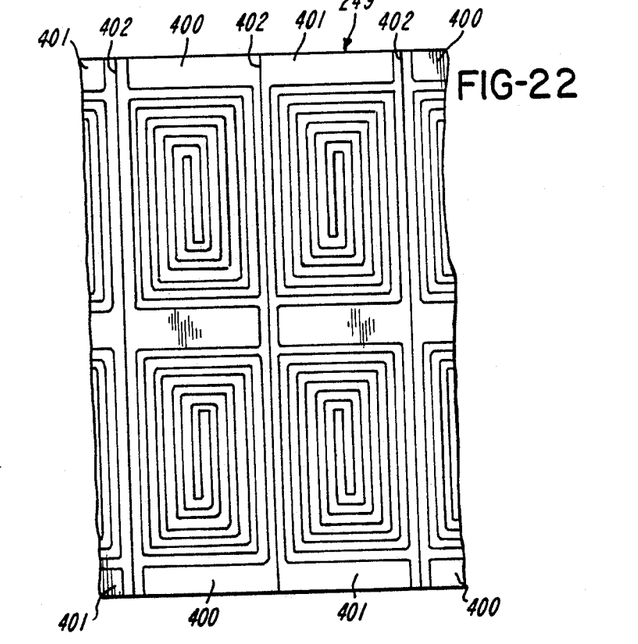
FIG. 22 is a top plan view of an alternative cut pattern for the web of conductive material corresponding generally to D in FIG. 5.

With reference initially to FIG. 22, web 249 of planar, electrically conductive material is cut in patterns of conductor spirals 400 and 401. The cut patterns include lateral or transverse lines of complete severing 402. The conductor spirals 400 and 401 are generally similar to the conductor spirals 25 and 30, however, inspection of FIG. 5 will indicate that all conductor spirals 25 and 30 are in very close proximity to each other in the longitudinal direction, being spaced only by knife cuts themselves. In addition, spirals 25 are connected to each other and spirals 30 are connected to each other. In contrast, in the embodiment of FIGS. 22 through 25, only the conductor spirals 400 and 401 between adjacent lines of complete severing 402 are connected to each other. In the method of FIGS. 22 through 25, reference may be had to FIG. 3 which shows that the conductor spiral webs 20 and 37 are separated as they pass partly about roll 66, thereafter dielectric material webs 28a and 28b are applied, the webs 20 and 37 are shifted longitudinally by the pitch of one conductor spiral 400 (or 401) plus the width of one conductor, and thereafter the webs 20 and 37 are re-laminated as they pass between rolls 86 and 87.

Figure 23:
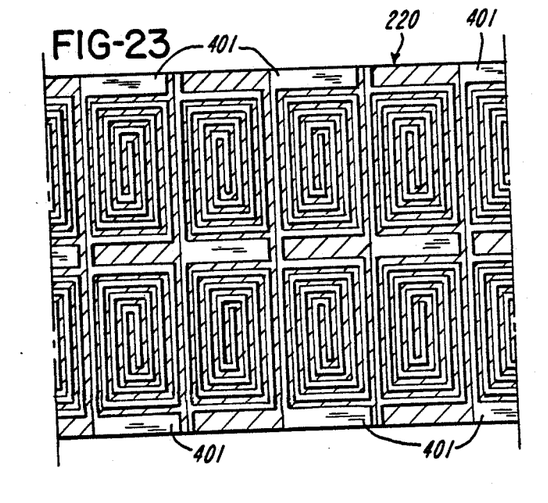
FIG. 23 is a top plan view of the alternative cut pattern with one-half of the conductive material removed and corresponding generally to G in FIG. 6.
Figure 24:
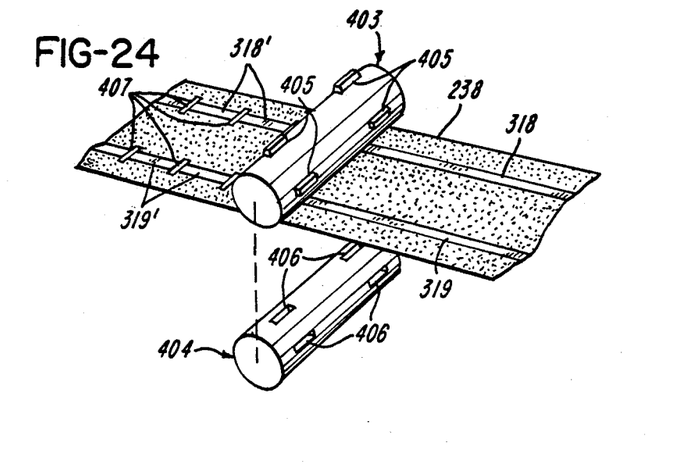
FIG. 24 is a diagrammatic perspective view showing the manner in which the webs of deactivating material are cut into stripes or strips.

As is evident from FIG. 23, once the web of resonant circuits 401 is stripped away, the resultant web 220 has pairs of resonant circuits 401 that are longitudinally spaced apart. In like manner, the pairs of resonant circuits 400 in the stripped away web (corresponding to the web 37 in FIG. 3), are also spaced apart longitudinally.

Figure 25:
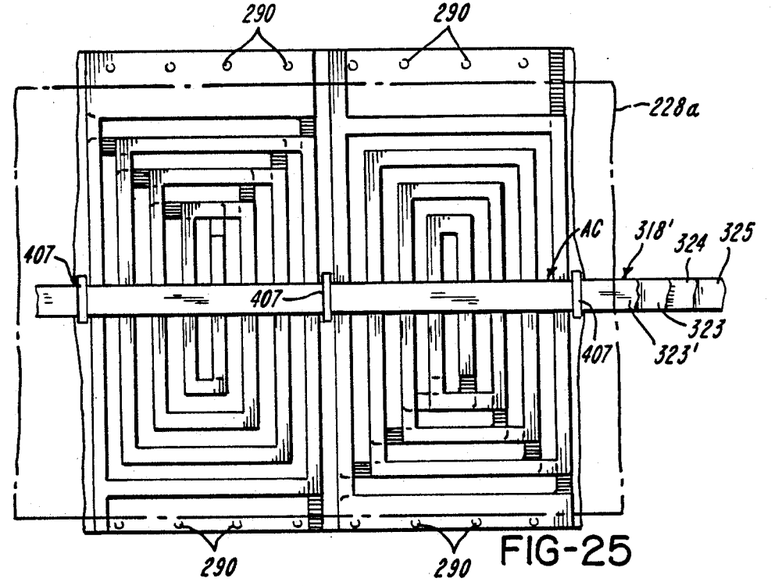
FIG. 25 is a top plan view of a pair of longitudinally spaced resonant circuits with separate respective deactivator strips.

The method of the embodiment of FIGS. 22 through 25, relates to production of deactivatable tags. The illustrated arrangement for deactivating the tags utilizes the arrangement taught in the embodiment of FIGS. 16 through 20 with the exception that the deactivator webs 318 and 319 (corresponding to the deactivator webs 118 and 119 in FIG. 16 for example), are separated into longitudinally spaced deactivator strips or stripes 318' and 319'. The separation is accomplished in accordance with the specific embodiment shown in FIG. 24, by punching out portions or holes 407 of the web 238 and the deactivator webs 318 and 319. For this purpose, a diagrammatically illustrated rotary punch 403 and a rotary die 404 are used. The rotary punch 403 has punches 405 and the rotary die 404 has cooperating die holes 406. The resultant holes 407 are wider than the spacing between the resonant circuits. The holes 407 are thus registered with the margins of the longitudinally spaced resonant circuits are shown in FIG. 25. Thus, static electricity cannot arc between resonant circuits in a longitudinal direction and static electricity cannot arc between deactivator strips 318' (or 319').

Other embodiments and modifications of the invention will suggest themselves to those skilled in the art, and all such of these as come within the spirit of this invention are included within its scope as best defined by the appended claims.

I claim:

1. Method of making tags for use in an electronic article surveillance system, comprising the steps of: providing a first web having a series of longitudinally recurring first patterns of adhesive, providing a second web having a series of longitudinally recurring second patterns of adhesive, cutting a web of conductive material to form longitudinally recurring pairs of first and second contiguous, coplanar, spiral conductors wrapped about each other, wherein the cutting step includes the step of completely severing each pair from the longitudinally adjacent pair, the first and second webs being positioned on opposite sides of the conductive material web with the first adhesive patterns in contact with only the first conductors and with the second adhesive patterns in contact with only the second conductors, separating the first web with the first conductors adhered thereto and the second web with the second conductors adhered thereto from each other, thereafter positioning the first and second conductors into a related arrangement for capacitive and inductive coupling, wherein each arrangement of first and second conductors is spaced from each adjacent arrangement of first and second conductors, providing a separate deactivator for each said arrangement with the deactivators being longitudinally spaced and with each deactivator including electrically conductive material, connecting the related first and second conductors to provide a composite tag web of a series of tags each having a resonant circuit, and whereby accidental deactivation of one resonant circuit in the composite tag web does not effect deactivation of any other resonant circuit spaced longitudinally therefrom in the composite tag web.

2. Method of making tags for use in an electronic article surveillance system, comprising the steps of: providing a longitudinally extending web of conductive material, cutting the web of conductive material to form a plurality of sets of conductors with each set having continuous, coplanar, first and second spiral conductors wrapped about each other, wherein the cutting step includes the step of completely severing each set from the longitudinally adjacent set, supporting the first spiral conductors in a first longitudinal extending conductor web, supporting the second spiral conductor in a second longitudinally extending conductor web, separating the first spiral conductor web and the second spiral conductor web from each other, shifting the first spiral conductor web and the second spiral conductor web longitudinally relative to each other to bring the first spiral conductors and the second spiral conductors into related arrangement for capacitive and inductive coupling, wherein each arrangement of first and second conductors is spaced from each adjacent arrangement of first and second conductors, providing a separate deactivator for each said arrangement with the deactivators being longitudinally spaced and with each deactivator including electrically conductive material, connecting the related first and second conductors to provide a series of tags each having a resonant circuit, and wherein accidental deactivation of one resonant circuit in the composite tag web does not effect deactivation of any other resonant circuit spaced longitudinally therefrom in the composite tag web.

3. Method of making a deactivatable tag for use in an electronic article surveillance system, comprising the steps of: providing a first web with a first series of longitudinally spaced first spiral conductors and a second web with a series of longitudinally spaced second spiral conductors, providing spaced strips of conductive material having a layer of normally non-conductive material, positioning the strips with the normally non-conductive layer adjacent either the first or the second series of conductors, adhering the first and second webs to each other, connecting the conductors of the first and second webs to each other to provide a series of spaced resonant circuits in a composite web and there being one of said strips for each resonant circuit, separating the composite web into tags each having a first conductor and a second conductor coupled to each other, and wherein the normally non-conductive layer can be rendered conductive in response to an energy level higher than that level necessary to activate the tag.

4. Method of making a deactivatable tag for use in an electronic article surveillance system, comprising the steps of: providing a first longitudinally extending web, printing conductive material on the first web, printing non-conductive material on the first web over the conductive material, providing discontinuities in the conductive material and the non-conductive material printed thereover to provide longitudinally spaced strips, providing a second web, providing longitudinally spaced pairs of first and second spiral conductors positioned between the first and second webs, adhering the webs to each other with pairs of the first and second spiral conductors connected to provide spaced resonant circuits with a strip in contact with each circuit but without contacting any other circuit, wherein the normally non-conductive material can be rendered conductive in response to an energy level higher than that level necessary to activate the tag, and separating the webs to provide tags each having a deactivatable circuit.

* * * * *